US009583065B2

(12) United States Patent
Chung et al.

(10) Patent No.: US 9,583,065 B2
(45) Date of Patent: Feb. 28, 2017

(54) GATE DRIVER AND DISPLAY DEVICE HAVING THE SAME

(71) Applicant: Samsung Display Co., Ltd., Yongin, Gyeonggi-Do (KR)

(72) Inventors: Bo-Yong Chung, Suwon-si (KR); Chul-Kyu Kang, Suwon-si (KR); Hae-Yeon Lee, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 38 days.

(21) Appl. No.: 14/692,625

(22) Filed: Apr. 21, 2015

(65) Prior Publication Data

US 2016/0210925 A1 Jul. 21, 2016

(30) Foreign Application Priority Data

Jan. 20, 2015 (KR) ........................ 10-2015-0009090

(51) Int. Cl.
*G09G 3/36* (2006.01)
*G09G 3/32* (2016.01)
*G11C 19/28* (2006.01)

(52) U.S. Cl.
CPC ......... *G09G 3/3677* (2013.01); *G09G 3/3266* (2013.01); *G11C 19/28* (2013.01); *G09G 2310/0286* (2013.01); *G09G 2310/0289* (2013.01); *G09G 2310/06* (2013.01); *G09G 2310/08* (2013.01)

(58) Field of Classification Search
CPC ..... G09G 3/3677; G09G 3/3622; G11C 19/28
See application file for complete search history.

(56) References Cited

U.S. PATENT DOCUMENTS

2012/0146969 A1* 6/2012 Sakamoto ........... G02F 1/13454
345/204
2012/0249502 A1* 10/2012 Takahashi ............ G09G 3/3677
345/205
2015/0138180 A1* 5/2015 Park ..................... G09G 3/3233
345/212

FOREIGN PATENT DOCUMENTS

| KR | 10-2013-0003252 A | 1/2013 |
| KR | 10-2013-0055258 A | 5/2013 |
| KR | 10-2014-0020484 A | 2/2014 |
| KR | 10-2014-0057794 A | 5/2014 |

\* cited by examiner

*Primary Examiner* — Liliana Cerullo
(74) *Attorney, Agent, or Firm* — Knobbe Martens Olson & Bear LLP

(57) ABSTRACT

A gate driver and a display device having the same are disclosed. In one aspect, the gate driver includes a plurality of stages configured to respectively output a plurality of gate output signals. An N-th stage includes a first input circuit configured to boost a first input signal to a first signal and transmit the first input signal to a first node. A second input circuit is configured to boost the first input signal to a second signal and transmit the fifth clock signal and a first direct current (DC) voltage to a second node. A stabilizing circuit is configured to boost a second input signal to a third signal, boost a second node signal to a fourth signal, and stabilize a first node signal. An initializing circuit is configured to initialize voltages at the first and second nodes and the first to fourth signals.

18 Claims, 8 Drawing Sheets

GATE DRIVER AND DISPLAY DEVICE HAVING THE SAME

INCORPORATION BY REFERENCE TO ANY PRIORITY APPLICATIONS

This application claims priority from and the benefit of Korean Patent Applications No. 10-2015-0009090, filed on Jan. 20, 2015 in the Korean Intellectual Property Office (KIPO), the disclosure of which is hereby incorporated by reference herein in its entirety.

BACKGROUND

Field

The described technology generally relates to gate drivers for driving gate lines of a display panel, and display devices having the same.

Description of the Related Technology

Generally, a display device includes a display panel and a display panel driver. The display panel includes a plurality of gate lines, a plurality of data lines, and a plurality of pixels. The display panel driver includes a controller, a gate driver and a data driver. The display panel and the display panel driver can be commonly formed on an oxide substrate.

SUMMARY OF CERTAIN INVENTIVE ASPECTS

Inventive aspects relate to a gate driver including N-channel Metal Oxide Semiconductor (NMOS) transistors and a display device including the gate driver.

Another aspect is a gate driver that comprises a plurality of stages respectively outputting a plurality of gate output signals. An N-th stage can include a first input circuit configured to transmit a first input signal to a first node in response to a first signal to which the first input signal is boosted, a second input circuit configured to transmit a fifth clock signal and a first direct current (DC) voltage to a second node in response to a first clock signal, a second clock signal, a fourth clock signal, and a second signal to which the first input signal is boosted, a stabilizing circuit configured to stabilize a first node signal, that is transmitted to the first node, in response to a third signal to which a second input signal is boosted, a fourth signal to which a second node signal, that is transmitted to the second node, is boosted, and a third clock signal, an initializing circuit configured to initialize voltages at the first and second nodes and the first to fourth signals in response to a second DC voltage and an initialization signal, and a buffer circuit configured to output a gate output signal in response to the first and second node signals, wherein N is a positive integer.

In example embodiments, the first input circuit includes a first input switching element having a gate electrode to which the second clock signal is applied, a drain electrode connected to a third input terminal to which the first input signal is applied, and a source electrode connected to a drain electrode of a second input switching element, the second input switching element having a gate electrode to which the first signal is applied, and a source electrode connected to the first node, wherein the first input signal transmitted from the first switching element is blocked from being applied to the first node, and a first capacitor connected between a first input terminal to which the first input signal is applied and the gate electrode of the second input switching element, and configured to boost the first input signal to the first signal.

In example embodiments, the second input circuit includes a third input switching element having a gate electrode to which the first clock signal is applied, a drain electrode to which the fifth clock signal is applied, and a source electrode connected to a drain electrode of a fourth input switching element, the fourth input switching element having a gate electrode to which the fourth clock signal is applied, a source electrode connected to the second node, wherein the fourth input switching element is connected to the third input switching element in series, a fifth input switching element having a gate electrode to which the second signal is applied, a drain electrode to which the first DC voltage is applied, and a source electrode connected to a drain electrode of a sixth input switching element, the sixth input switching element having a gate electrode to which the second clock signal is applied and a source electrode connected to the second node, wherein the sixth input switching element is connected to the fifth input switching element in series, and a second capacitor connected between the third input terminal and the gate electrode of the fifth input switching element, and configured to boost the first input signal to the second signal.

In example embodiments, the stabilizing circuit includes a first stabilizing circuit configured to stabilize the first node signal to the first DC voltage in response to the third signal. The first stabilizing circuit can include a first switching element having a gate electrode to which the third signal is applied, a drain electrode to which the first DC voltage is applied, and a source electrode connected to the first node, and a third capacitor connected between a second input terminal to which the second input signal is applied and the gate electrode of the first switching element, and configured to boost the second input signal to the third signal.

In example embodiments, the stabilizing circuit further includes a second stabilizing circuit configured to stabilize the first node signal to the first DC voltage in response to the fourth signal and the third clock signal. The second stabilizing circuit can include a second switching element having a gate electrode to which the fourth signal is applied, a drain electrode to which the first DC voltage is applied, and a source electrode connected to a drain electrode of a third switching element, the third switching element having a gate electrode to which the third clock signal is applied and a source electrode connected to the first node, and a fourth capacitor connected between the second node and the gate electrode of the second switching element, and configured to boost the second node signal to the fourth signal.

In example embodiments, the initializing circuit includes a first initializing circuit configured to initialize the first, second, and fourth signals based on the second DC voltage, and a second initializing circuit configured to initialize the first and second node signals and the third signal based on the first and second DC voltages.

In example embodiments, the first initializing circuit includes a first initialization switching element configured to transmit the second DC voltage lower than the first DC voltage to the first capacitor in response to the initialization signal to initialize a voltage that is stored in the first capacitor, a second initialization switching element configured to transmit the second DC voltage to the fourth capacitor in response to the initialization signal to initialize a voltage that is stored in the fourth capacitor, and a third initialization switching element configured to transmit the second DC voltage to the second capacitor in response to the initialization signal to initialize a voltage that is stored in the second capacitor.

In example embodiments, the second initializing circuit includes a fourth initialization switching element configured to transmit a low level of a first concurrent driving signal to the third input terminal in response to the initialization signal, a fifth initialization switching element configured to transmit the second DC voltage lower than the first DC voltage to the second capacitor in response to the initialization signal to initialize a voltage that is stored in the second capacitor, a sixth initialization switching element configured to transmit the first DC voltage to the first node in response to the initialization signal, and a seventh initialization switching element configured to transmit the first DC voltage to the second node in response to the initialization signal.

In example embodiments, the buffer circuit includes a pull-up unit configured to pull up the gate output signal in response to the first node signal, and a pull-down unit configured to pull down the gate output signal in response to the second node signal.

In example embodiments, the pull-up unit includes a pull-up switching element having a gate electrode connected to the first node, a drain electrode to which a sixth clock signal is applied, and a source electrode connected to an output terminal which output the gate output signal. The pull-down unit can include a pull-down switching element having a gate electrode connected to the second node, a source electrode connected to the output terminal, and a drain electrode to which a first concurrent driving signal.

In example embodiments, the sixth clock signal has a timing substantially the same as a timing of the third clock signal. A low level of the sixth clock signal can be substantially the same as a low level of the gate output signal.

In example embodiments, the N-th stage further includes a concurrent driving control circuit configured to deactivate the pull-up unit in response to a second concurrent driving signal. The concurrent driving control circuit can include a concurrent switching element having a gate electrode to which the second concurrent driving signal is applied, a drain electrode to which the first DC voltage is applied, and a source electrode connected to the first node.

In example embodiments, amplitudes that the first and second input signals are changed to the first and second signals correspond to a voltage difference between a low level of the first input signal and the second DC voltage.

In example embodiments, an amplitude that the second node signal is changed to the fourth signal corresponds to a voltage difference between a voltage at the second node and the second DC voltage.

In example embodiments, the first DC voltage is lower than a low level of the gate output signal, the second DC voltage is lower than the first DC voltage, and a low level of the initialization signal is substantially the same as the second DC voltage.

In example embodiments, the first to fourth clock signals have different timings each other. Low levels of the first to fourth clock signals can be substantially the same as the second DC voltage.

In example embodiments, the fifth clock signal has a timing substantially the same as a timing of the first clock signal. A low level of the fifth clock signal can be substantially the same as the low level of the gate output signal.

Another aspect is a gate driver that comprises a gate driver can comprise a plurality of stages respectively outputting a plurality of gate output signals. An N-th stage can include a first input circuit configured to transmit an input signal to a first node in response to a first clock signal, a second input circuit configured to transmit a modified first clock signal to a second node in response to a first signal to which the first input signal is boosted, a stabilizing circuit configured to stabilize a first node signal, that is transmitted to the first node, in response to a second signal to which a second node signal, that is transmitted to the second node, is boosted such that a first node signal has a first direct current (DC) voltage, an initializing circuit configured to initialize a voltage at the second node, the first signal, and the second signal based on an initialization signal, the first DC voltage, and a second DC voltage, a buffer circuit including a pull-up unit and a pull-down unit for outputting a gate output signal in response to the first and second node signals, and a concurrent driving control circuit configured to deactivate the pull-up unit in response to a concurrent driving signal, wherein N is a positive integer.

In example embodiments, the first DC voltage is lower than a low level of the input signal, the second DC voltage can be lower than the first DC voltage, and a low level of the initialization signal is substantially the same as the second DC voltage. The modified first clock signal can have a timing substantially the same as a timing of the first clock signal, and a low level of the modified first clock signal can be higher than a low level of the first clock signal.

Another aspect is a display device that comprises a display panel including a plurality of pixels, a data driver configured to output a plurality of data signals to the display panel via a plurality of data lines, and a gate driver including a plurality of stages respectively outputting a plurality of gate output signals via a plurality of gate lines. An N-th stage can include a first input circuit configured to transmit a first input signal to a first node in response to a first signal to which the first input signal is boosted, a second input circuit configured to transmit a fifth clock signal and a first direct current (DC) voltage to a second node in response to a first clock signal, a second clock signal, a fourth clock signal, and a second signal to which the first input signal is boosted, a first stabilizing circuit configured to stabilize a first node signal, that is transmitted to the first node, in response to a third signal to which a second input signal is boosted, a second stabilizing circuit configured to stabilize the first node signal in response to a fourth signal to which a second node signal, that is transmitted to the second node, is boosted, an initializing circuit configured to initialize voltages at the first and second nodes and the first to fourth signals in response to an initialization signal, and a buffer circuit configured to output a gate output signal in response to the first and second node signals, wherein N is a positive integer.

Another aspect is a gate driver for a display device, comprising a plurality of stages configured to respectively output a plurality of gate output signals, wherein an N-th stage of the stages is configured to receive first to fifth clock signals, where N is a positive integer and comprises: a first input circuit configured to boost a first input signal to a first signal and transmit the first input signal to a first node based on the first signal; a second input circuit configured to boost the first input signal to a second signal and transmit the fifth clock signal and a first direct current (DC) voltage to a second node based on the first clock signal, the second clock signal, the fourth clock signal, and the second signal; a stabilizing circuit configured to boost a second input signal to a third signal, boost a second node signal to a fourth signal, and stabilize a first node signal based on the third signal, the fourth signal, and the third clock signal, wherein the first node signal corresponds to a signal at the first node, and wherein the second node signal corresponds to a signal at the second node; an initializing circuit configured to initialize voltages at the first and second nodes and the first to fourth signals based on a second DC voltage and an initialization signal; and a buffer circuit configured to output a gate output signal based on the first and second node signals.

In the above gate driver, the N-th stage further comprises first to third input terminals, wherein the first and third input terminals are configured to receive the first input signal, and wherein the first input circuit includes: a first input switching element having a gate electrode configured to receive the second clock signal, a drain electrode electrically connected to the third input terminal, and a source electrode; a second input switching element having a gate electrode configured to receive the first signal, a drain electrode electrically connected to the source electrode of the first input switching element, and a source electrode electrically connected to the first node, wherein the first input switching element is configured to block the first input signal from being applied to the first node; and a first capacitor electrically connected between the first input terminal and the gate electrode of the second input switching element and configured to boost the first input signal to the first signal.

In the above gate driver, the second input circuit includes: a third input switching element having a gate electrode configured to receive the first clock signal, a drain electrode configured to receive the fifth clock signal, and a source electrode; a fourth input switching element having a gate electrode configured to receive the fourth clock signal, a source electrode electrically connected to the second node, and a drain electrode electrically connected to the source electrode of the third input switching element, wherein the fourth input switching element is electrically connected to the third input switching element in series; a fifth input switching element having a gate electrode configured to receive the second signal, a drain electrode configured to receive the first DC voltage, and a source electrode; a sixth input switching element having a gate electrode configured to receive the second clock signal, a source electrode electrically connected to the second node, and a drain electrode electrically connected to the source electrode of the fifth input switching element, wherein the sixth input switching element is electrically connected to the fifth input switching element in series; and a second capacitor electrically connected between the third input terminal and the gate electrode of the fifth input switching element and configured to boost the first input signal to the second signal.

In the above gate driver, the second input terminal is configured to receive the second input signal, wherein the stabilizing circuit includes a first stabilizing circuit configured to stabilize the first node signal to the first DC voltage based on the third signal, and wherein the first stabilizing circuit includes: a first switching element having a gate electrode configured to receive the third signal, a drain electrode configured to receive the first DC voltage, and a source electrode electrically connected to the first node; and a third capacitor electrically connected between the second input terminal and the gate electrode of the first switching element and configured to boost the second input signal to the third signal.

In the above gate driver, the stabilizing circuit further includes a second stabilizing circuit configured to stabilize the first node signal to the first DC voltage based on the fourth signal and the third clock signal, and wherein the second stabilizing circuit includes: a second switching element having a gate electrode configured to receive the fourth signal, a drain electrode configured to receive the first DC voltage, and a source electrode; a third switching element having a gate electrode configured to receive the third clock signal, a source electrode electrically connected to the first node, and a drain electrode electrically connected to the source electrode of the second switching element; and a fourth capacitor electrically connected between the second node and the gate electrode of the second switching element and configured to boost the second node signal to the fourth signal.

In the above gate driver, the initializing circuit includes: a first initializing circuit configured to initialize the first, second, and fourth signals based on the second DC voltage; and a second initializing circuit configured to initialize the first and second node signals and the third signal based on the first and second DC voltages.

In the above gate driver, the first initializing circuit includes: a first initialization switching element configured to transmit the second DC voltage lower than the first DC voltage to the first capacitor based on the initialization signal so as to initialize a voltage in the first capacitor; a second initialization switching element configured to transmit the second DC voltage to the fourth capacitor based on the initialization signal so as to initialize a voltage in the fourth capacitor; and a third initialization switching element configured to transmit the second DC voltage to the second capacitor based on the initialization signal so as to initialize a voltage in the second capacitor.

In the above gate driver, the second initializing circuit includes: a fourth initialization switching element configured to transmit a first level of a first concurrent driving signal to the third input terminal based on the initialization signal, wherein the first concurrent driving signal has two levels: the first level and a second level greater than the first level; a fifth initialization switching element configured to transmit the second DC voltage lower than the first DC voltage to the second capacitor based on the initialization signal so as to initialize a voltage in the second capacitor; a sixth initialization switching element configured to transmit the first DC voltage to the first node based on the initialization signal; and a seventh initialization switching element configured to transmit the first DC voltage to the second node based on the initialization signal.

In the above gate driver, the buffer circuit includes: a pull-up circuit configured to pull up the gate output signal based on the first node signal; and a pull-down circuit configured to pull down the gate output signal based on the second node signal.

In the above gate driver, the pull-up circuit includes a pull-up switching element having a gate electrode electrically connected to the first node, a drain electrode configured to receive a sixth clock signal, and a source electrode electrically connected to an output terminal configured to output the gate output signal, wherein the pull-down circuit includes a pull-down switching element having a gate electrode electrically connected to the second node, a source electrode electrically connected to the output terminal, and a drain electrode configured to receive a first concurrent driving signal.

In the above gate driver, the sixth clock signal and the gate output signal each has two levels: a first level and a second level greater than the first level, wherein the sixth clock signal has a timing substantially the same as a timing of the third clock signal, and wherein the first level of the sixth clock signal is substantially the same as the first level of the gate output signal.

In the above gate driver, the N-th stage further includes a concurrent driving control circuit configured to deactivate the pull-up circuit based on a second concurrent driving signal, wherein the concurrent driving control circuit includes a concurrent switching element having a gate electrode configured to receive the second concurrent driving signal, a drain electrode configured to receive the first DC voltage, and a source electrode electrically connected to the first node.

In the above gate driver, the first input signal has two levels: a first level and a second level greater than the first level, wherein amplitudes of the first and second signals correspond to a voltage difference between the first level of the first input signal and the second DC voltage.

In the above gate driver, an amplitude of the fourth signal corresponds to a voltage difference between a voltage at the second node and the second DC voltage.

In the above gate driver, each of the gate output signal and the initialization signal has two levels: a first level and a second level greater than the first level, wherein the first DC voltage is lower than the first level of the gate output signal, wherein the second DC voltage is lower than the first DC voltage, and wherein the first level of the initialization signal is substantially the same as the second DC voltage.

In the above gate driver, each of the first to fourth clocks has two levels: a first level and a second level greater than the first level, wherein the first to fourth clock signals have different timings from each other, wherein the first levels of the first to fourth clock signals are substantially the same as the second DC voltage.

In the above gate driver, the fifth clock has two levels: a first level and a second level greater than the first level, wherein the fifth clock signal has a timing substantially the same as a timing of the first clock signal, wherein the first level of the fifth clock signal is substantially the same as the first level of the gate output signal.

Another aspect is gate driver for a display device, comprising a plurality of stages configured to respectively output a plurality of gate output signals. An N-th stage of the stages, where N is a positive number comprises: a first input circuit configured to transmit an input signal to a first node based on a first clock signal; a second input circuit configured to boost the first input signal to a first signal and transmit a modified first clock signal to a second node based on the first signal; a stabilizing circuit configured to boost a second node signal to a second signal and stabilize a first node signal based on the second signal such that the first node signal has a first direct current (DC) voltage, wherein the first and second node signals respectively correspond to signals at the first and second nodes; an initializing circuit configured to initialize a voltage at the second node, the first signal, and the second signal based on an initialization signal, the first DC voltage, and a second DC voltage; a buffer circuit including a pull-up circuit and a pull-down circuit and configured to output a gate output signal based on the first and second node signals; and a concurrent driving control circuit configured to deactivate the pull-up circuit based on a concurrent driving signal.

In the above gate driver, each of the input signal, the initialization signal, and the modified first clock signal has two levels: a first level and a second level greater than the first level, wherein the first DC voltage is lower than the first level of the input signal, wherein the second DC voltage is lower than the first DC voltage, wherein the first level of the initialization signal is substantially the same as the second DC voltage, wherein the modified first clock signal has a timing substantially the same as a timing of the first clock signal, and wherein the first level of the modified first clock signal is greater than the first level of the first clock signal.

Another aspect is a display device comprising: a display panel including a plurality of pixels; a data driver configured to output a plurality of data signals to the display panel via a plurality of data lines; and a gate driver including a plurality of stages configured to respectively output a plurality of gate output signals via a plurality of gate lines. An N-th stage of the stages is configured to receive first to fifth cock signals, where N is a positive integer, and comprises: a first input circuit configured to boost a first input signal to a first signal and transmit a first input signal to a first node based on the first signal; a second input circuit configured to boost the first input signal to a second signal and transmit the fifth clock signal and a first direct current (DC) voltage to a second node based on the first clock signal, the second clock signal, the fourth clock signal, and the second signal; a first stabilizing circuit configured to boost a second input signal to a third signal and stabilize a first node signal based on the third signal, wherein the first node signal corresponds to a signal at the first node; a second stabilizing circuit configured to boost a second node signal to a fourth signal and stabilize the first node signal based on the fourth signal, wherein the second node signal corresponds to a signal at the second node; an initializing circuit configured to initialize voltages at the first and second nodes and the first to fourth signals based on an initialization signal; and a buffer circuit configured to output a gate output signal based on the first and second node signals.

According to at least one of the disclosed embodiments, the gate driver having the NMOS switching elements and the display device decrease (or boost) the voltages applied to the gate electrodes of the switching elements that have the negative threshold voltages to have lower than the threshold voltages (or source voltages of the switching elements) using the initializing circuit and the capacitors when the switching elements are turned off. Also, the low levels of the input signals and the clock signals can be set different each other to decrease the gate voltage of the switching elements. In addition, the gate driver can include the first input circuit for blocking the low level VGL of the first input signal from being applied to the first node. The gate driver can include the first and second stabilizing circuits that apply the first DC voltage to the first node to maintain stably a turned-off state of the pull-up unit. Thus, the NMOS switching elements can be normally turned on/off. As a result, abnormal output of the gate output signal from the gate driver according to the threshold voltage variations of the NMOS switching elements can be improved. Further, image quality and reliability of the display device having the NMOS switching elements can be improved.

DETAILED DESCRIPTION OF CERTAIN INVENTIVE EMBODIMENTS

The gate driver can include a plurality of n-type metal oxide semiconductor (NMOS) transistors formed on the oxide substrate. In general, signals having a high voltage level (VGH) and a low voltage level (VGL) applied to the gate driver are higher than or equal to about 0V. Here, the NMOS transistors formed on the oxide substrate can have various negative threshold voltages because of the characteristics of the NMOS transistors. Thus, when the low level voltage corresponding to about 0V is applied to a gate electrode of the NMOS transistor, the NMOS transistor cannot be normally turned off (or turned on) because a gate-source voltage of the NMOS transistor in a floating state is greater than the threshold voltage. In other words, when a switching element has a negative threshold voltage, typical gate drivers cannot output a gate output signal at proper timing.

Exemplary embodiments will be described more fully hereinafter with reference to the accompanying drawings, in which various embodiments are shown. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
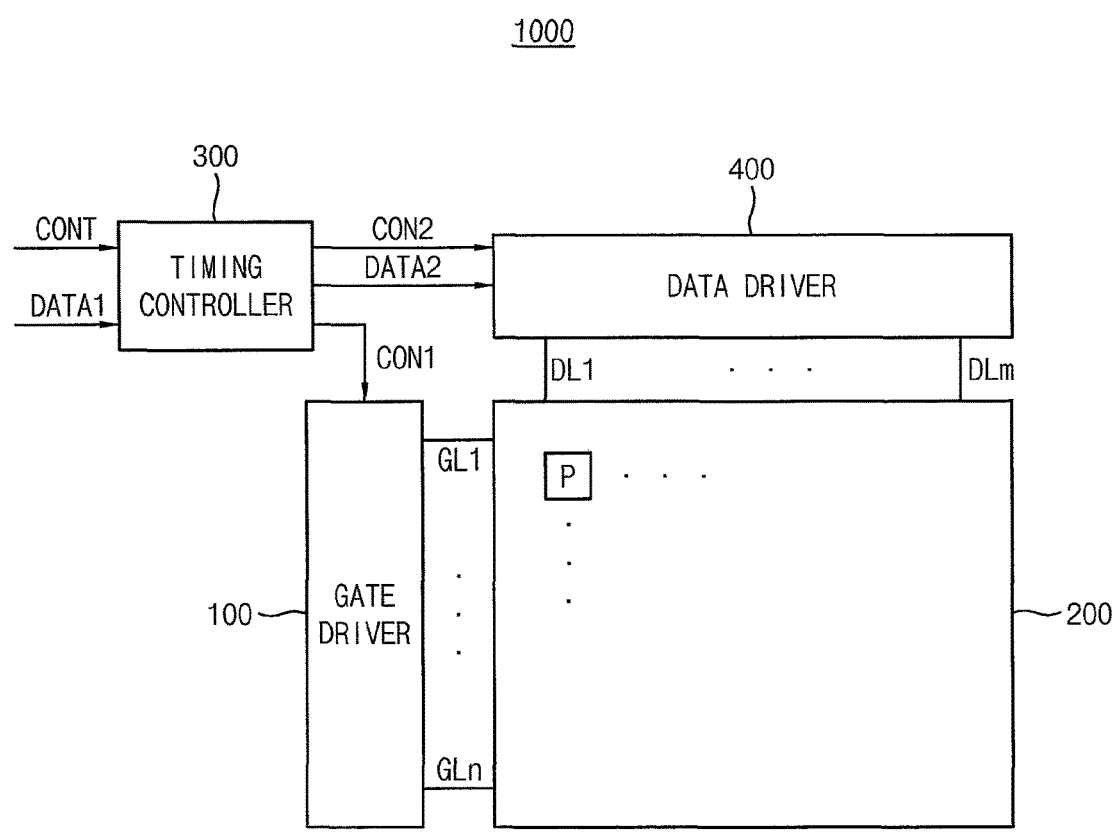
FIG. 1 is a block diagram of a display device according to example embodiments.

FIG. 1 is a block diagram of a display device according to example embodiments.

Referring to FIG. 1, a display device 1000 includes a gate driver 100, a display panel 200, a timing controller 300, and a data driver 400.

For example, the display device 1000 can be an organic light emitting diode (OLED) display. Alternatively, the display device 1000 can be a liquid crystal display (LCD).

The display panel 200 displays an image. The display panel 200 includes a plurality of gate lines GL1 to GLn, a plurality of data lines DL1 to DLm, and a plurality of pixels P connected to the gate lines GL1 to GLn and the data lines DL1 to DLm. For example, the pixels P can be formed in a matrix form. In example embodiments, the number of the gate lines GL1 to GLn n, and the number of the data lines DL1 to DLm m, where n and m are positive integers. In some embodiments, the number of the pixels P is n×m.

The timing controller 300 receives an input control signal CONT and an input image signal DATA1 from an image source such as an external graphic apparatus. The timing controller 300 generates a data signal DATA2 which can be a digital type and correspond to operating conditions of the display panel 200 based on the input image signal DATA1. In addition, the timing controller 300 generates a first control signal CONT1 for controlling a driving timing of the gate driver 100 and a second control signal CONT2 for controlling a driving timing of the data driver 400 based on the input control signal CONT. The timing controller 300 outputs the first and second control signals CONT1 and CONT2 to the gate driver 100 and the data driver 400, respectively.

The data driver 400 converts the data signal DATA2 received from the timing controller 300 into a data signal (or a data voltage) of an analog type based on the second control signal CONT2 received from the timing controller 300. The data driver 240 outputs the data signal (or the data voltage) to the data lines DL1 to DLm.

The gate driver 100 generates gate signals to drive the gate lines GL1 to GLn based on the first control signal CONT1 received from the timing controller 300. The gate driver 100 sequentially or concurrently outputs the gate signals to the gate lines GL1 to GLn in each frame. The gate driver 100 can include a plurality of stages respectively outputting a plurality of gate output signals (i.e., gate signals). In some embodiments, an N-th stage includes a first input circuit configured to transmit a first input signal to a first node in response to a first signal to which the first input signal is boosted (or decreased) and a second input circuit configured to transmit a fifth clock signal and a first direct current (DC) voltage to a second node in response to a first clock signal, a second clock signal, a fourth clock signal, and a second signal to which the first input signal is boosted (or decreased). The N-th stage can also include a stabilizing circuit configured to stabilize a first node signal that is transmitted to the first node, in response to a third signal to which a second input signal is boosted (or decreased), a fourth signal to which a second node signal, that is transmitted to the second node, is boosted (or decreased), and a third clock signal. The N-th stage can further include an initializing circuit configured to initialize voltages at the first and second nodes and the first through fourth signals in response to a second DC voltage and an initialization signal and a buffer circuit configured to output a gate output signal in response to the first and second node signals, wherein N is a positive integer. In some embodiments, switching elements included in the gate driver 100 are N-channel metal oxide semiconductor (NMOS) transistors. In some embodiments, the gate driver 100 is built in the display panel 200 that is formed on an oxide substrate.

Hereinafter, an operation of the display panel 200 is briefly explained.

When the gate signal (the gate output signal) is applied to one of the gate lines GL1 to GLn and the data voltages (the data signals) are applied to the data lines DL1 to DLm, the switching elements of the pixels P connected to the gate line to which the gate signal is applied are turned on so that the data voltages are transmitted to the pixels P connected to the gate line to which the gate signal is applied. The pixels P display an image according to levels of the data voltages.

Figure 2:
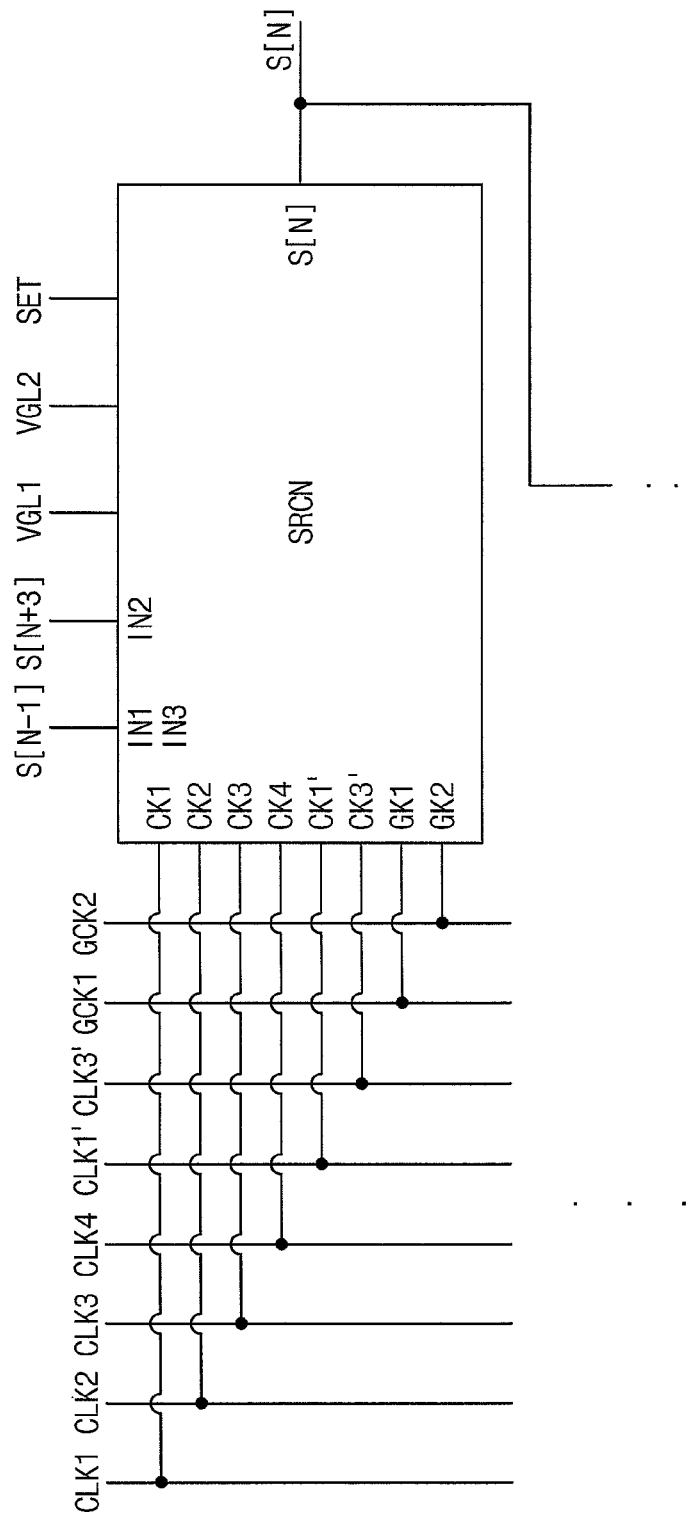
FIG. 2 is a block diagram of a gate driver according to example embodiments.
Figure 3:
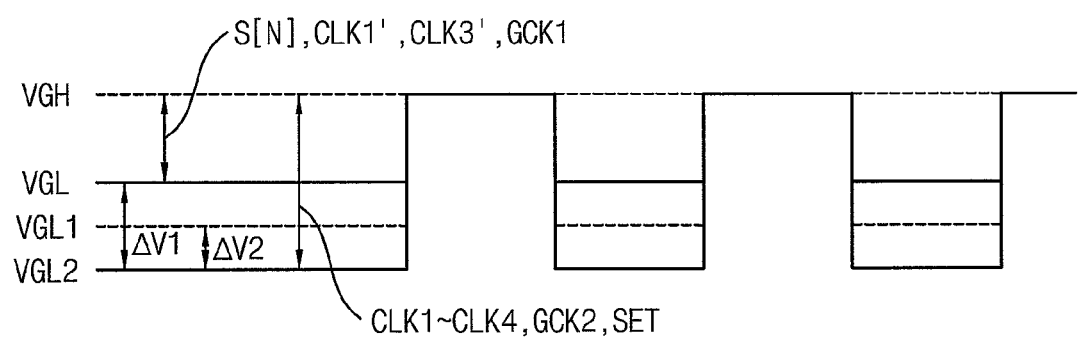
FIG. 3 is a diagram illustrating an example of voltage levels of signals that are applied to the gate driver of FIG. 2.

FIG. 2 is a block diagram of a gate driver according to example embodiments. FIG. 3 is a diagram illustrating an example of voltage levels of signals that are applied to the gate driver of FIG. 2.

Referring to FIGS. 1 to 3, the gate driver 100 includes a plurality of stages connected to one another.

The N-th stage SRCN can include first to sixth clock terminals CK1, CK2, CK3, CK4, CK1', and CK2', first to third input terminals IN1, IN2, and IN3, and an output terminal S[N]. The N-th stage SCRN can further include first and second concurrent driving signal input terminals GK1 and GK2, first and second DC voltage input terminals, and an initialization signal input terminal.

In some embodiments, first to fourth clock signals CLK1, CLK2, CLK3, and CLK4 having different timings are respectively applied to the first to fourth clock terminals CK1 to CK4. For example, the third clock signal CLK3 is a signal inverted from the first clock signal CLK1 and the fourth clock signal CLK4 is a signal inverted from the second clock signal CLK2.

In some embodiments, the fourth, first, second, and third clock signals CLK4, CLK1, CLK2, and CLK3 can be respectively applied to the first to fourth clock terminals CK1, CK2, CK3, and CK4 of (N−1)th stage. In addition, the second, third, fourth, and first clock signals CLK2, CLK3, CLK4, and CLK1 can be respectively applied to the first to fourth clock terminals CK1, CK2, CK3, and CK4 of (N+1)th stage.

A vertical start signal or a gate output signal S[N−1] of a previous stage can be applied to the first and third input terminal IN1 and IN3. For example, the vertical start signal is applied to the first and third input terminals IN1 and IN3 of a first stage. The gate output signals of the previous stages can be respectively applied to the first and third input terminals IN1 and IN3 of second to N-th stages. The gate output signal after 3 stages or an input signal S[N+3] having a timing that corresponds to a timing of the gate output signal after 3 stages can be applied to the second input terminal IN2. For example, the input signal S[N+3] delayed 3 horizontal periods from the gate output signal S[N] is applied to the second input terminal IN2 of the N-th stage.

The output terminal S[N] can output the gate output signal the gate line electrically connected to the output terminal S[N]. For example, a gate output signal output from the first stage (e.g., S[1]) is output in sync with a high level of the third clock signal CLK3, a gate output signal output from a second stage (e.g., S[2]) is output in sync with a high level of the fourth clock signal CLK4, a gate output signal output from a third stage (e.g., S[3]) is output in sync with a high level of the first clock signal CLK1, and a gate output signal output from a fourth stage (e.g., S[4]) is output in sync with a high level of the second clock signal CLK2.

As illustrated in FIG. 3, the gate output signal S[N], the first input signal S[N−1], and the second input signal S[n+3] of the N-th stage SCRN have two voltage levels each corresponding to a high DC voltage level VGH and a low DC voltage level VGL. In some embodiments, the first DC voltage VGL1 is less than the low DC voltage level VGL (and a low level of the gate output signal S[N]). In addition, the second DC voltage VGL2 can be less than the first DC voltage VGL1. A low level of the initialization signal SET can be substantially the same as the second DC voltage. As a result, each of the low levels of the signals are different so that a sufficiently low voltage can be applied to a gate electrode of the NMOS switching element when the NMOS switching element is turned off. For example, the low DC voltage level VGL corresponds to about 0V, the first DC voltage VGL1 corresponds to about −2V, and the second DC voltage VGL2 corresponds to about −4V.

In some embodiments, low levels of the first to fourth clock signals CLK1, CLK2, CLK3, and CLK4 are substantially the same as the second DC voltage VGL2. A fifth clock signal CLK1' applied to a fifth clock terminal CK1' can have a timing substantially the same as a timing of the first clock signal CLK1. A low level of the fifth clock signal CLK1' can be substantially the same as the low level VGL of the gate output signal S[N] (i.e., the low DC voltage level VGL). Similarly, a sixth clock signal CLK2' applied to a sixth clock terminal CK2' can have a timing substantially the same as a timing of the third clock signal CLK3. A low level of the sixth clock signal CLK2' can be substantially the same as the low level VGL of the gate output signal S[N] (i.e., the low DC voltage level VGL).

First and second concurrent driving signals GCK1 and GCK2 can be commonly applied to first and second concurrent driving signal input terminals GK1 and GK2 of the all stages, respectively. The first concurrent driving signal GCK1 can have timing substantially the same as a timing of the second concurrent driving signal GCK2. A low level of the second concurrent driving signal GCK2 can be less than a low level of the first concurrent driving signal GCK1. For example, the low level of the second concurrent driving signal GCK2 is substantially the same as the second DC voltage VGL2. The low level of the first concurrent driving signal GCK1 can be substantially the same as the low level VGL of the gate output signal S[N] (i.e., the low DC voltage level VGL).

As described above, the low levels of the clock signals and voltage levels of the DC voltages applied to the stages can have different levels according to gate-source voltages of the NMOS switching elements such that on/off malfunction of the NMOS switching elements that have negative threshold voltages can be improved. Hereinafter, the operation of the gate driver 100 will be explained with reference to FIGS. 4 to 6.

Figure 4:
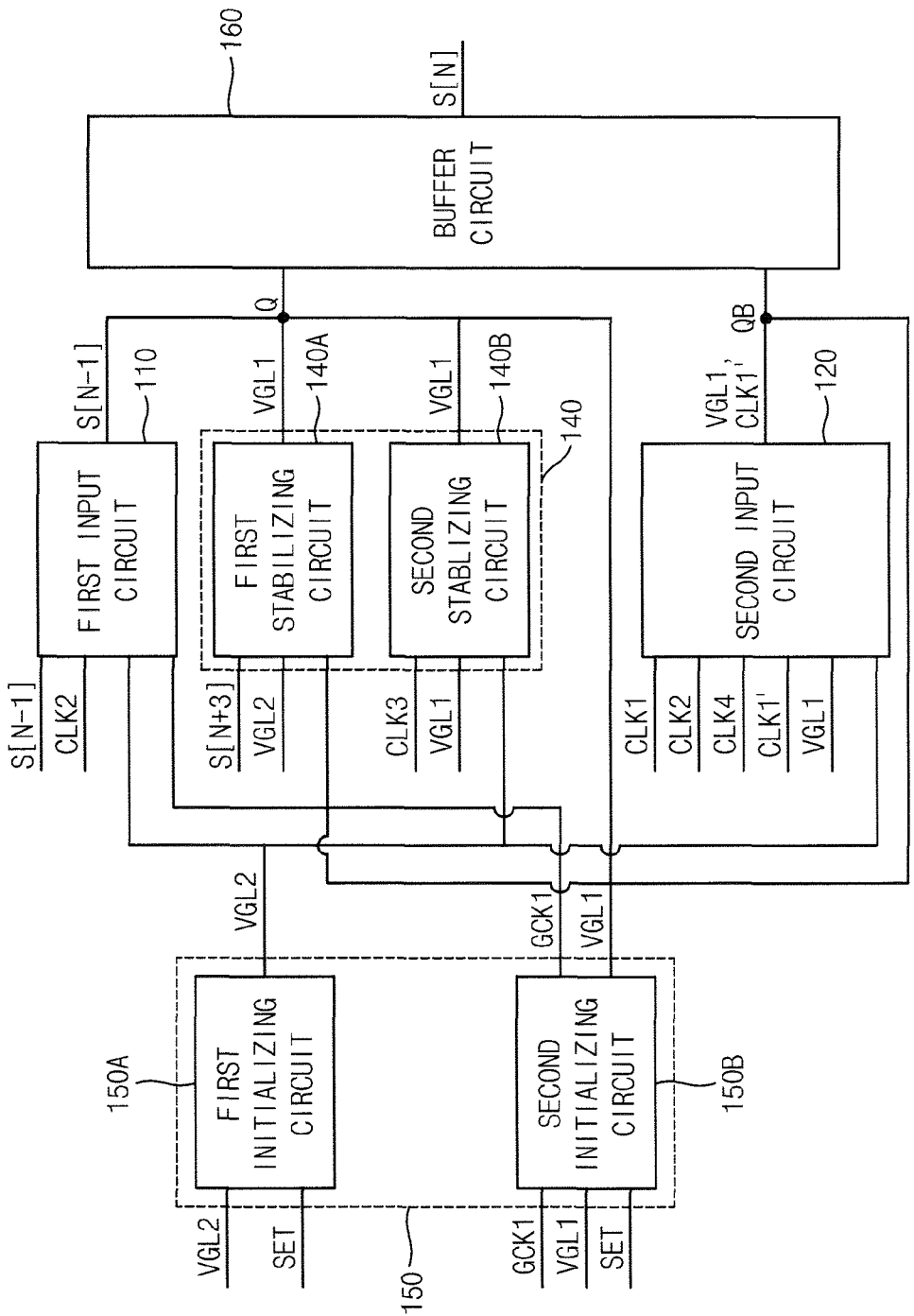
FIG. 4 is a block diagram illustrating an example of an (N)th stage of the gate driver of FIG. 2.
Figure 5:
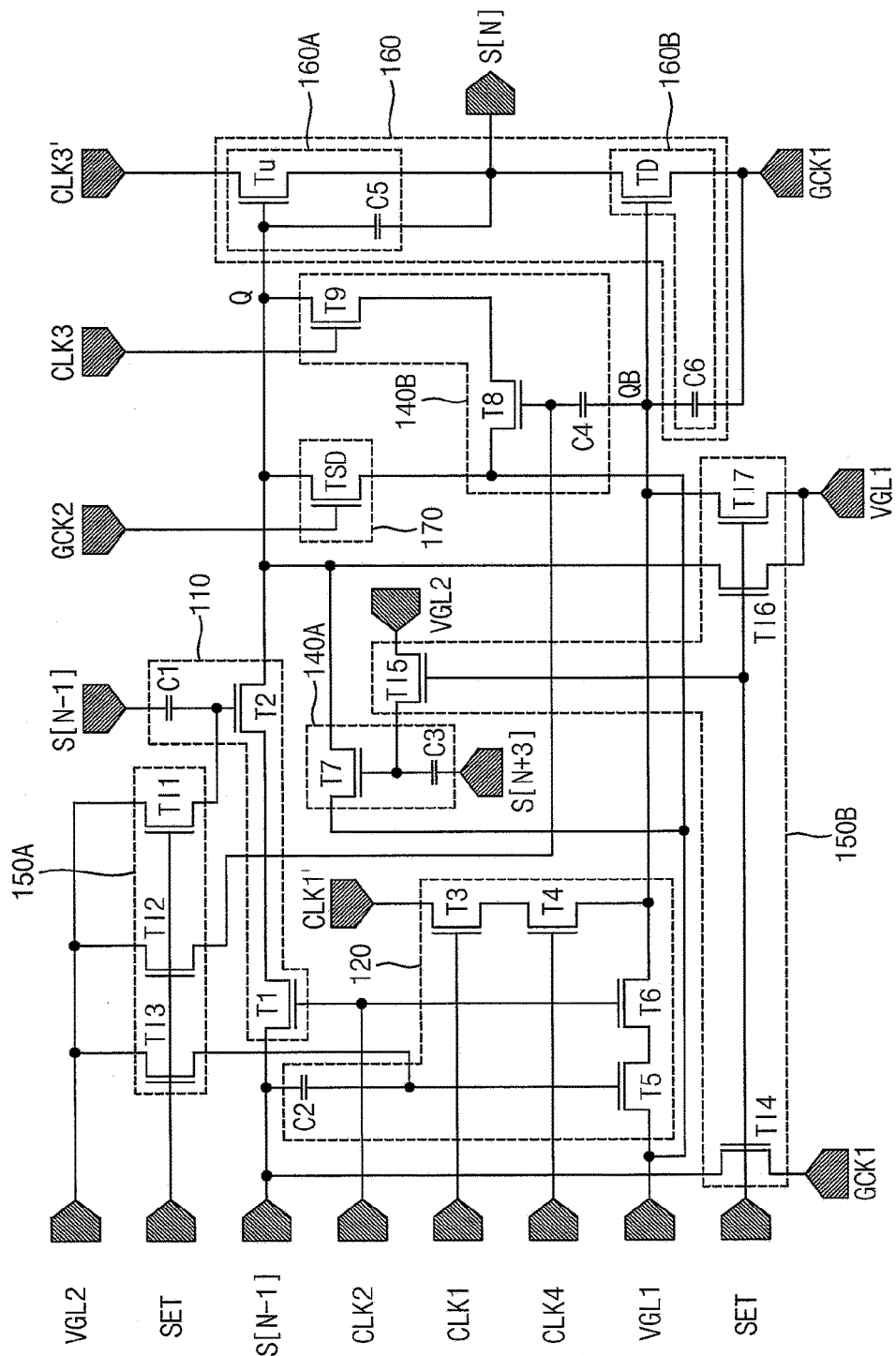
FIG. 5 is a circuit diagram illustrating an example of an (N)th stage of the gate driver of FIG. 2.
Figure 6:
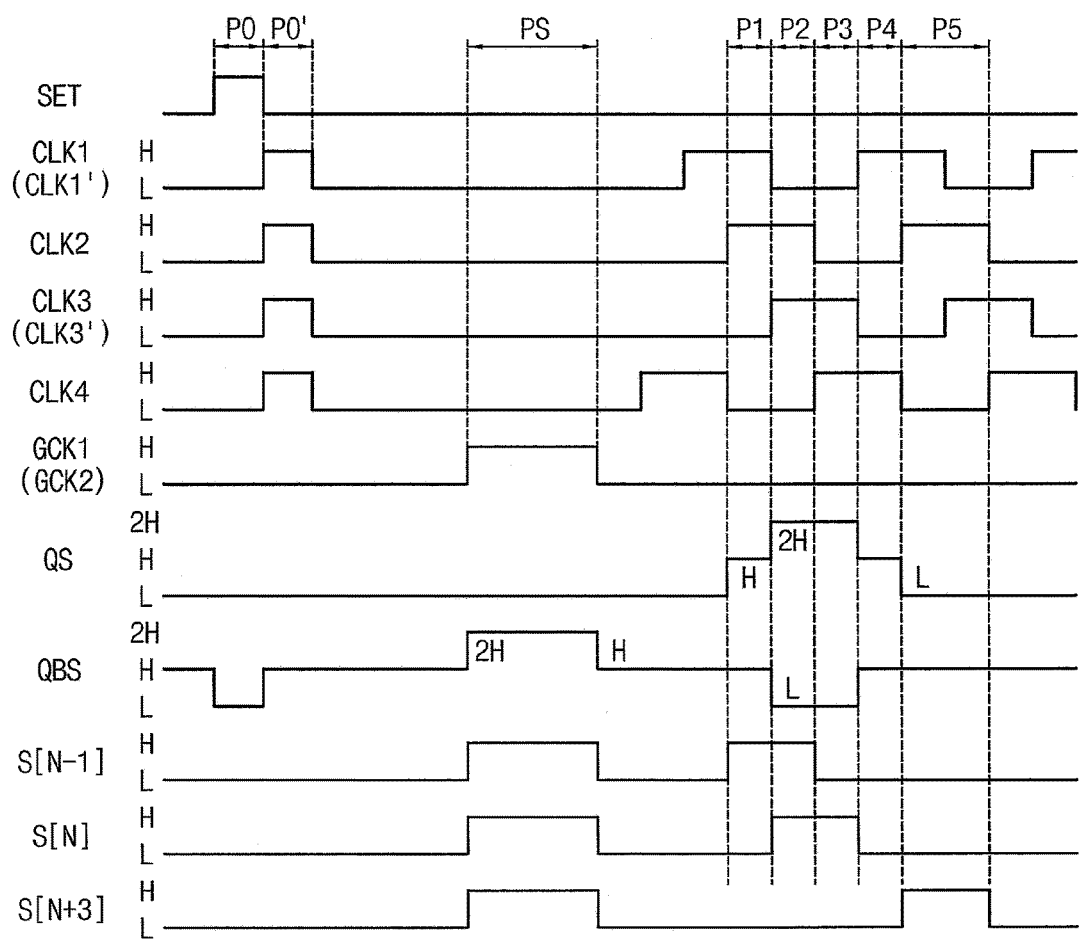
FIG. 6 is a timing diagram illustrating an example operation of the gate driver of FIG. 2.

FIG. 4 is a block diagram illustrating an example of an (N)th stage of the gate driver of FIG. 2. FIG. 5 is a circuit diagram illustrating an example of an (N)th stage of the gate driver of FIG. 2. FIG. 6 is a timing diagram illustrating an example of an operation of the gate driver of FIG. 2.

Referring to FIGS. 1 to 6, the N-th stage SCRN includes a first input circuit 110, a second input circuit 120, a stabilizing circuit 140, an initializing circuit 150, and a buffer circuit 160. The N-th stage SCRN can further include a concurrent driving control circuit 170. The stabilizing circuit 140 can include a first stabilizing circuit 140A and a second stabilizing circuit 140B. The initializing circuit 150 can include a first initializing circuit 150A and a second initializing circuit 150B. As described above, the switching elements in the gate driver 100 are NMOS transistors.

The first input circuit 110 can transmit a first input signal S[N−1] to a first node Q in response to a first signal to which the first input signal is boosted (or decreased). The first input circuit 110 can include a first input switching element T1 having a gate electrode to which the second clock signal CLK2 is applied, a drain electrode connected to a third input terminal IN3 to which the first input signal S[N−1] is applied, and a source electrode connected to a drain electrode of a second input switching element T2. The first input circuit 110 can also include the second input switching element T2 having a gate electrode to which the first signal is applied, and a source electrode connected to the first node Q. The first input circuit 110 can further include a first capacitor C1 connected between a first input terminal IN1 to which the first input signal S[N−1] is applied and the gate electrode of the second input switching element T2. The first input signal S[N−1] transmitted from the first switching element T1 can be blocked from being applied to the first node Q. The first capacitor C1 can boost (or decrease) the first input signal S[N−1] to the first signal. The first capacitor C1 can be a bootstrap capacitor that stores a voltage difference (e.g., ΔV1 represented in FIG. 3) between the voltage level of the first input signal S[N−1] and the second DC voltage VGL2 that is applied by the operation of the initializing circuit 150. The first signal can correspond to a voltage that the first input signal S[N−1] is decreased (or is boosted) the voltage difference ΔV1 in a negative direction. The first signal can be applied to the gate electrode of the second input switching element T2. Thus, when the second input switching element T2 has a negative threshold voltage, a sufficiently low voltage (e.g., the first signal) is applied to the gate electrode of the second input switching element T2 by the stored voltage in the first capacitor C1 so that a current does not flow through the second input switching element T2. Therefore, second input switching element T2 can be normally turned on/off.

The second switching element T2 can block the first input signal S[N−1] from being applied to the first node Q. For example, the second switching element T2 blocks the low level of the first input signal S[N−1] higher than the first DC voltage VGL2 from being applied to the first node Q such that accuracy of on/off controlling the buffer circuit 160 can be improved.

The second input circuit 120 can transmit the fifth clock signal CLK1' and the first DC VGL1 voltage to the second node QB in response to the first clock signal CLK1, the second clock signal CLK2, the fourth clock signal CLK4, and the second signal to which the first input signal S[N−1] is boosted (or decreased). The second input circuit 120 can include a third input switching element T3 having a gate electrode to which the first clock signal CLK1 is applied, a drain electrode to which the fifth clock signal CLK1' is applied, and a source electrode connected to a drain electrode of a fourth input switching element T4. The second input circuit 120 can also include the fourth input switching element T4 having a gate electrode to which the fourth clock signal CLK4 is applied, a source electrode connected to the second node QB. The second input circuit 120 can further include a fifth input switching element T5 having a gate electrode to which the second signal is applied, a drain electrode to which the first DC voltage VGL1 is applied, and a source electrode connected to a drain electrode of a sixth input switching element T6. The second input circuit 120 can also include the sixth input switching element T6 having a gate electrode to which the second clock signal CLK2 is applied and a source electrode connected to the second node QB, and a second capacitor C2 connected between the third input terminal IN3 and the gate electrode of the fifth input switching element T5. The fourth input switching element T4 can be connected to the third input switching element T3 in series. The sixth input switching element T6 can be connected to the fifth input switching element T5 in series. The second capacitor C2 can boost (or decrease) the first input signal S[N−1] to the second signal. The second capacitor C2 can be a bootstrap capacitor that stores a voltage difference (e.g., ΔV1 represented in FIG. 3) between the voltage level of the first input signal S[N−1] (e.g., a low level of the first input signal S[N−1]) and the second DC voltage VGL2 that is applied by the operation of the initializing circuit 150. The second node QB can have a low voltage level during a period the gate output signal S[N] is output. The second signal can correspond to a voltage that the first input signal S[N−1] is decreased (or is boosted) the voltage difference ΔV1 in a negative direction. The second signal can be applied to the gate electrode of the fifth input switching element T5. Therefore, although the fifth input switching element T5 has a negative threshold voltage, the fifth input switching element T5 can be normally turned on/off.

The stabilizing circuit 140 can stabilize the first node signal in response to the third signal to which the second input signal S[N+3] is boosted, the fourth signal to which the second node signal is boosted, and the third clock signal CLK3. The stabilizing circuit 140 can include the first stabilizing circuit 140A configured to stabilize the first node signal to the first DC voltage VGL1 in response to the third signal and the second stabilizing circuit 140B configured to stabilize the first node signal to the first DC voltage VGL1 in response to the fourth signal and the third clock signal CLK3.

The first stabilizing circuit 140A can include a first switching element T7 having a gate electrode to which the third signal is applied, a drain electrode to which the first DC voltage VGL1 is applied, and a source electrode connected to the first node Q. The first stabilizing circuit 140A can also include a third capacitor C3 connected between the second input terminal IN2 to which the second input signal S[N+3] is applied and the gate electrode of the first switching element T7. The third capacitor C3 can boost the second input signal S[N+3] to the third signal. The third capacitor C3 can be a bootstrap capacitor that stores a voltage difference (e.g., ΔV1 represented in FIG. 3) between the voltage level of the second input signal S[N+3] (e.g., a low level of the second input signal S[N+3]) and the second DC voltage VGL2. The third signal can correspond to a voltage when the second input signal S[N+3] is decreased (or is boosted) by the voltage difference ΔV1 in a negative direction. The second signal can be applied to the gate electrode of the first switching element T7. Therefore, although the first switching element T7 has a negative threshold voltage, the first switching element T7 can be normally turned on/off.

The first stabilizing circuit 140A can transmit the first DC voltage VGL1 to the first node Q during a period P5 (represented in FIG. 6) when the second input signal S[N+3] is output. Thus, the first stabilizing circuit 140A can transmit the first DC voltage to the first node Q so that the first node signal which is transmitted to the first node Q can be stably maintained.

The second stabilizing circuit 140B can stabilize the first node signal to the first DC voltage VGL1 in response to the fourth signal and the third clock signal CLK3. The second stabilizing circuit 140B can include a second switching element T8 having a gate electrode to which the fourth signal is applied, a drain electrode to which the first DC voltage VGL1 is applied, and a source electrode connected to a drain electrode of a third switching element T9. The third switching element has a gate electrode to which the third clock signal CLK3 is applied and a source electrode connected to the first node Q. The second stabilizing circuit 140B can include a fourth capacitor C4 connected between the second node QB and the gate electrode of the second switching element T8. The fourth capacitor C4 can boost the second node signal to the fourth signal. An output from the second stabilizing circuit 140B can be output in sync with the third clock signal CLK3, so that the second stabilizing circuit 140B can stabilize the first node signal to be the first DC voltage VGL1.

As a result, the first and second stabilizing circuits 140A and 140B can maintain the first node signal to be the first DC voltage VGL1 in different periods.

The initializing circuit 150 can initialize voltages at the first and second nodes Q and QB and the first to fourth signals in response to the second DC voltage VGL2 and the initialization signal SET. For example, the voltages stored in the first to fourth capacitors C1 to C4 are initialized in an initialization period P0 (represented in FIG. 6). In some embodiments, the initializing circuit 150 includes the first initializing circuit 150A configured to initialize the first, second, and fourth signals based on the second DC voltage VGL2, and the second initializing circuit 150B configured to initialize the first and second node signals and the third signal based on the first and second DC voltages VGL1 and VGL2. The second DC voltage VGL2 can be lower than the first DC voltage VGL1.

The first initializing circuit 150A can include a first initialization switching element TI1 configured to transmit the second DC voltage VGL2 lower than the first DC voltage VGL1 to the first capacitor C1 in response to the initialization signal SET to initialize a voltage that is stored in the first capacitor C1. The first initializing circuit 150A can also include a second initialization switching element TI2 configured to transmit the second DC voltage VGL2 to the fourth capacitor C4 in response to the initialization signal SET to initialize a voltage that is stored in the fourth capacitor C4. The first initializing circuit 150A can further include a third initialization switching element TI3 configured to transmit the second DC voltage VGL2 to the second capacitor C2 in response to the initialization signal SET to initialize a voltage that is stored in the second capacitor C2. Thus, boosted amplitudes of the first input signal S[N−1] by the first and second capacitors C1 and C2 can correspond to a voltage difference (e.g., ΔV2 represented in FIG. 3) between the low level of the first input signal S[N−1] and the second DC voltage VGL2. A boosted amplitude of the second node signal by the fourth capacitor C4 can correspond to a voltage difference between a voltage of the second node QB and the second DC voltage VGL2 (e.g., ΔV2 represented in FIG. 3).

The second initializing circuit 150B can include a fourth initialization switching element TI4 configured to transmit a low level of the first concurrent driving signal GCK1 to the third input terminal IN3 in response to the initialization signal SET. The second initializing circuit 150B can also include a fifth initialization switching element TI5 configured to transmit the second DC voltage VGL2 lower than the first DC voltage VGL1 to the second capacitor C2 in response to the initialization signal SET to initialize a voltage that is stored in the second capacitor C2. The second initializing circuit 150B can further include a sixth initialization switching element TI6 configured to transmit the first DC voltage VGL1 to the first node Q in response to the initialization signal SET, and a seventh initialization switching element TI7 configured to transmit the first DC voltage VGL1 to the second node QB in response to the initialization signal SET.

The initializing unit 150 can initialize the voltages of the first and second nodes Q and QB in the initialization period P0 such that the voltages of the first and second nodes Q and QB can have the first DC voltage VGL1 in the initialization period P0. The initializing unit 150 can initialize the voltages stored in the first to fourth capacitors C1 to C4. The first to fourth capacitors C1 to C4 can boost voltage applied to the gate electrodes of the switching elements (e.g., T2, T5, T7, and T8) based on the stored voltages (or the initialized voltages).

The buffer circuit 160 can output the gate output signal S[N] in response to the first and second node signals. The buffer circuit 160 can include a pull-up unit or pull-up circuit 160A configured to pull up the gate output signal S[N] in response to the first node signal, and a pull-down unit or pull-down circuit 160B configured to pull down the gate output signal S[N] in response to the second node signal.

The pull-up unit 160A can include a pull-up switching element TU having a gate electrode connected to the first node Q, a drain electrode to which the sixth clock signal CLK3' is applied, and a source electrode connected to the output terminal which output the gate output signal S[N]. The pull-up unit 160A can further include a capacitor C5 connected between the gate electrode of the pull-up switching element TU and the source electrode of the pull-up switching element TU. In some embodiments, the sixth clock signal CLK3' has a timing substantially the same as a timing of the third clock signal CLK3. A low level of the sixth clock signal CLK3' can be substantially the same as a low level of the gate output signal S[N] (and the low level of the input signals S[N−1] and S[N+3]). Thus, a gate voltage of the pull-up switching element TU can be lower than a source-drain voltage of the pull-up switching element TU.

The pull-down unit 160B can include a pull-down switching element TD having a gate electrode connected to the second node QB, a source electrode connected to the output terminal, and a drain electrode to which the first concurrent driving signal GCK1.

In some embodiments, a pull-down voltage includes the first concurrent driving signal GCK1. The gate driver 100 is operated in a sequential driving mode and in a concurrent driving mode. In the sequential driving mode, the first concurrent driving signal GCK1 has a low level L. In the concurrent driving mode, the first concurrent driving signal GCK1 has a high level H.

In some embodiments, the N-th stage SCRN further includes a concurrent driving control circuit 170 configured to deactivate the pull-up unit 160A in response to the second concurrent driving signal GCK2. The concurrent driving control circuit 170 can include a concurrent switching element TSD having a gate electrode to which the second concurrent driving signal GCK2 is applied, a drain electrode to which the first DC voltage VGL1 is applied, and a source electrode connected to the first node Q.

The gate driver 100 is operated in the sequential driving mode and in the concurrent driving mode. In the sequential driving mode, the first and second concurrent driving signals GCK1 and GCK2 have the low level L. When the first concurrent driving signal GCK1 has the low level L, the pull-up unit 160A pulls up the gate output signal S[N] in response to the signal at the first node Q.

In the concurrent driving mode, the first and second concurrent driving signals GCK1 and GCK2 have the high level H. When the first concurrent driving signal GCK1 has the high level H, the signal at the first node Q has a low level L by the first DC voltage VGL1 so that the pull-up unit 160A is deactivated. In the concurrent driving mode, the gate output signal S[N] can be pulled up and down using the pull-down unit 160B.

Hereinafter, the operation of the gate driver 100 will be explained with reference to FIG. 6.

The initialization signal SET can have a high level H in a first initialization period P0 so that the voltages at the first and second nodes Q and QB (e.g., the first and second nodes signals QS and QBS) can be initialized to have the first voltage level VGL1. In some embodiments, a low level L of the first and second node signals is substantially the same as the first DC voltage VGL1. In some embodiments, a low level of the initialization signal SET corresponds to the second DC voltage VGL2 lower than the first DC voltage VGL1. In the first initialization period P0, the first to fourth capacitors C1 to C4 can store initial voltages (e.g., boosted signals) by the operation of the initializing circuit 150. For example, a voltage difference between a low level L (represented by VGL in FIG. 3) of an input signal (e.g., S[N−1] and S[N+3]) and the second DC voltage VGL2 is stored in the first to third capacitors C1 to C3. The voltage difference can be between the first DC voltage VGL1 and the second DC voltage VGL2. The first to fourth capacitors C1 to C4 can decrease (or boost) the voltages applied to the gate electrodes of the switching elements according to the voltage differences. The first to fourth capacitors C1 to C4 operate as bootstrap capacitors.

In a second initialization period P0', the first to sixth clock signals CLK1, CLK2, CLK3, CLK4, CLK1', and CLK3' can concurrently have a high level H, so that the voltage at the second node QB (e.g., the second node signal QBS) can have a first high level H by the second input circuit 120.

In the concurrent driving mode, all the stages of the gate driver 100 can concurrently output gate output signals, respectively.

In the concurrent driving period PS, the first and second concurrent driving signals GCK1 and GCK2 can have a high level H, the first node signal QS can have the low level L, and the second node signal QBS can have a second high level 2H. The pull-up unit 160A can be deactivated by the first node signal QS. The pull-down unit 160B can generate the gate output signal having a high level H using the first concurrent driving signal GCK1 in response to the second node signal QB. Then, when the first concurrent driving signal GCK1 changes to the low level L, the second node signal QBS can change to the first high level H and the gate output signal S[N] can change to the high level H.

In the sequential driving mode, the stages of the gate driver 100 sequentially output the gate output signals. In the sequential driving mode, the first and second concurrent driving signals GCK1 and GCK2 are have the high level H.

In a first period P1, the first input signal S[N−1], the first clock signal CLK1, and the second clock signal CLK2 have the high level H, and the second node signal QBS maintains the first high level H. Here, the first node signal QS has the first high level H by the operation of the first input circuit 110.

In a second period P2, when the first clock signal CLK1 turns back to the low level L and the third clock signal CLK3 turns back to the high level H, the first node signal QS bootstrapped by the capacitor C5 of the pull-up unit 160A so that the first node signal QS has the second high level 2H and the gate output signal S[N] having the high level H is output to the output terminal.

In a third period P3, when the second clock signal CLK2 turns back to the low level L and the fourth clock signal CLK4 turns back to the high level H, the first input signal S[N−1] has the low level. Here, the second node signal QBS maintains the low level L and the first node signal QS maintains the second high level 2H. Thus, the gate output signal S[N] maintains the high level H.

In a fourth period P4, the third clock signal CLK3 turns back to the low level L and the first clock signal CLK1 turns back to the high level H. The second node signal QBS changes the first high level H by the second input unit 120 and the first node signal QS changes to the first high level H. Thus, the pull-down unit 160B turns on in response to the second node signal QBS and the gate output signal S[N] has the low level L.

In a fifth period P5, the second clock signal CLK2 turns back to the high level H, the fourth clock signal CLK4 turns back to the low level L, and the second input signal S[N+3] has the high level H. The first node signal QS has the low level L by the first stabilizing circuit 140A.

Then, the first node signal QS maintains the low level L and the second node signal QBS maintains the first high level H so that the gate output signal S[N] maintains the low level L.

The low levels L of the first and second input signals S[N−1] and S[N+3] and the low level of the gate output signal S[N] can be substantially the same as a low DC voltage VGL. The low level of the first and second node signals QS and QBS can be substantially the same as the first DC voltage VGL1 lower than the low DC voltage VGL.

As described above, the gate driver 100 can decrease (or boost) the voltages applied to the gate electrodes of the switching elements that have the negative threshold voltages to have voltages lower than the threshold voltages (or source voltages of the switching elements) using the initializing circuit 250A and 205B and the capacitors when the switching elements are turned off. Also, the low levels of the input signals and the clock signals can be set differently from each other to decrease the gate voltage of the switching elements. In addition, the gate driver 100 can include the first input circuit 110 for blocking the low level VGL of the first input signal S[N−1] from being applied to the first node Q. The gate driver 100 can include the first and second stabilizing circuits 140A and 140B that apply the first DC voltage VGL1 to the first node Q to maintain stably a turned-off state of the pull-up unit 160A. Thus, the NMOS switching elements can be normally turned on/off. As a result, abnormal output of the gate output signal S[N] from the gate driver 100 according to the threshold voltage variations of the NMOS switching elements can be improved. Further, image quality and reliability of the display device 1000 having the NMOS switching elements can be improved.

Figure 7:
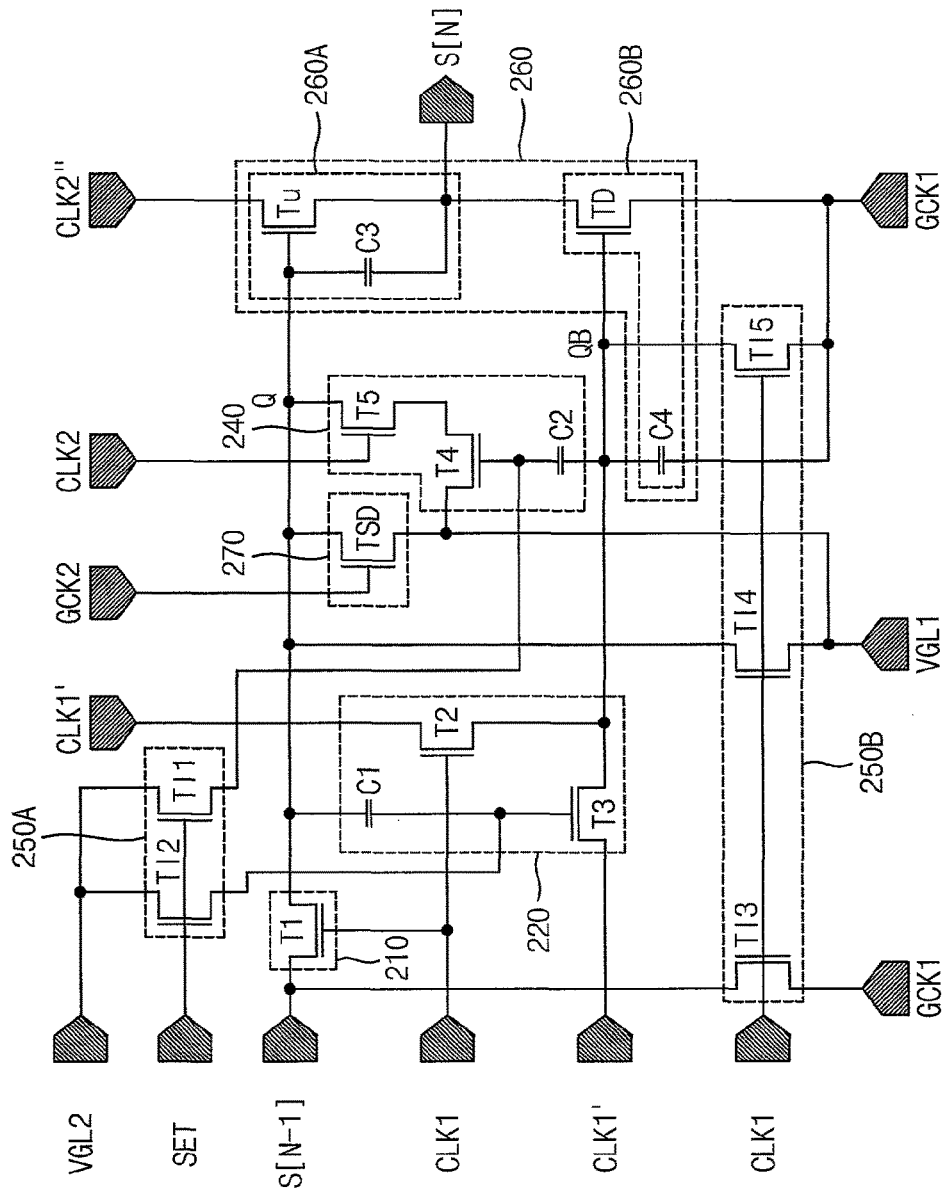
FIG. 7 is a circuit diagram of an (N)th stage of a gate driver according to example embodiments.
Figure 8:
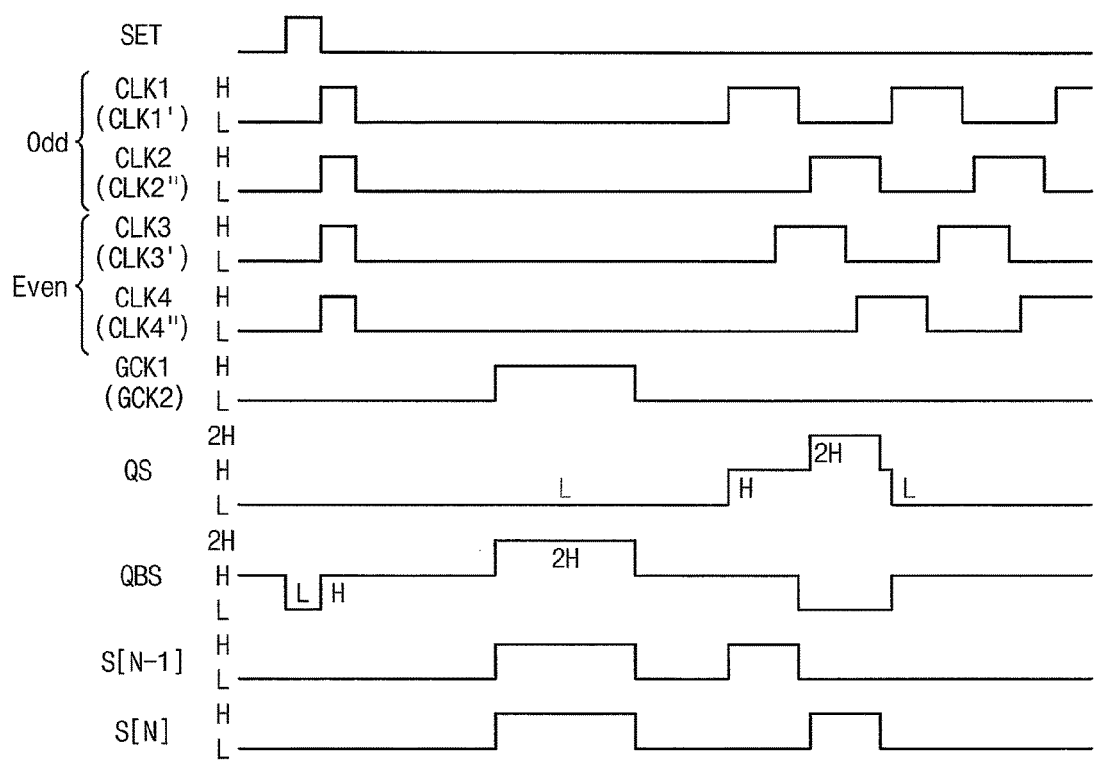
FIG. 8 is a timing diagram illustrating an example operation of the gate driver of FIG. 7.

FIG. 7 is a circuit diagram of an (N)th stage of a gate driver according to example embodiments. FIG. 8 is a timing diagram illustrating an example of an operation of the gate driver of FIG. 7.

Referring to FIGS. 1, 3, 4, 7, and 8, the gate driver 200 includes a plurality of stages connected to one another.

The N-th stage includes a first input circuit 210, a second input circuit 220, a stabilizing circuit 240, an initializing circuit 250A and 250B, a buffer circuit 260, and a concurrent driving control circuit 270. The initializing circuit 250A and 250B can include a first initializing circuit 250A and a second initializing circuit 250B. As described above, the switching elements in the gate driver 200 are NMOS transistors. The N-th stage can correspond to an odd stage or an even stage.

The first input circuit 210 can include a first input switching element T1 for transmitting an input signal S[N−1] to a first node Q in response to a first clock signal CLK1.

The second input circuit 220 can transmit a modified clock signal CLK1' to a second node QB in response to a first signal to which the first input signal S[N−1] is boosted (or decreased). The second input circuit 220 can include a second input switching element T2 having a gate electrode to which the first clock signal CLK1 is applied, a drain electrode to which the modified first clock signal CLK1' is applied, and a source electrode connected to the second node QB. The second input circuit 220 can also include a third input switching element T3 having a gate electrode to which the first signal is applied, a drain electrode to which the modified first clock signal CLK1' is applied, and a source electrode connected to the second node QB. The second input circuit 220 can further include a first capacitor C1 connected between the source electrode of the first input switching element T1 and the gate electrode of the third input switching element T3. In some embodiments, the modified clock signal CLK1' has a timing substantially the same as a timing of the first clock signal CLK1, and a low level of the modified first clock signal CLK1' is higher than a low level of the first clock signal CLK1.

The stabilizing circuit 240 can stabilize a first node signal QS in response to a second signal to which a second node signal QBS is boosted such that a first node signal QS has a first DC voltage VGL1. The first DC voltage VGL1 can be lower than the low level of the input signal S[N−1]. In some embodiments, the stabilizing circuit 240 includes a first switching element T4 having a gate electrode to which the second signal is applied, a drain electrode to which the first DC voltage VGL1 is applied, and a source electrode connected to a drain electrode of a second switching element T5. The stabilizing circuit 240 can include second switching element T5 having a gate electrode to which a second clock signal is applied and a source electrode connected to the first node Q, and a second capacitor C2 connected to the second node QB and the gate electrode of the first switching element T4. The second capacitor C2 can boost (or decrease) the second node signal QBS to the second signal.

The initializing circuit 250A and 250B can initialize a voltage at the second node QB (e.g., the second node signal QBS), the first signal, and the second signal based on an initialization signal SET, the first DC voltage VGL1, and a second DC voltage VGL2.

The first initializing circuit 250A can include first and second initialization switching elements TI1 and TI2. The first initialization switching element TI1 can apply the second DC voltage VGL2 lower than the first DC voltage VGL1 to the second capacitor C2 in response to the initialization signal SET so that the second signal can be initialized. The second initialization switching element TI2 can apply the second DC voltage VGL2 to the first capacitor C1 in response to the initialization signal SET so that the first signal can be initialized. The second initializing circuit 250B can include third to fifth initialization switching elements TI3, TI4, and TI5. The third initialization switching element TI3 can apply a low level of a first concurrent driving signal GCK1 to the drain electrode of the first input switching element T1 in response to the initialization signal SET. The fourth initialization switching element TI4 can apply the first DC voltage VGL1 to the first node Q in response to the initialization signal SET. The fifth initialization switching element TI5 can apply the first DC voltage VGL1 to the second node QB in response to the initialization signal SET. The initializing circuit 250 can initialize the voltages at the first and second nodes Q and QB (e.g., the first and second signals QS and QBS), and voltages stored in the first and second capacitors C1 and C2. The first and second capacitors can boost voltage applied to the gate electrodes of the switching elements (e.g., T3 and T4) based on the stored voltages (or the initialized voltages). Since the operation of the initializing circuit is described above referred to FIGS. 4 to 6, duplicate description will not be repeated.

The buffer circuit 260 can include a pull-up unit 260A and a pull-down unit 260B for outputting a gate output signal S[N] in response to the first and second node signals QS and QBS. The pull-up unit 260A can include a pull-up switching element TU configured to output a modified second clock signal CLK2″ to an output terminal in response to the first node signal QS. The pull-down unit 260B can include a pull-down switching element TD configured to a first concurrent driving signal GCK1 to the output terminal in response to the second node signal QBS. In some embodiments, the modified second clock signal CLK2″ has a timing substantially same as a timing of the second clock signal CLK2, and a low level of the modified second clock signal CLK2″ is higher than a low level of the second clock signal CLK2. Since the constructions and operation of the buffer circuit are described above referred to FIGS. 4 to 6, duplicate description will not be repeated.

The concurrent driving control circuit 270 can deactivate the pull-up unit 260A in response to a second concurrent driving signal GCK2. The concurrent driving control circuit 270 can include a concurrent switching element TSD having a gate electrode to which the second concurrent driving signal GCK2 is applied, a drain electrode to which the first DC voltage VGL1 is applied, and a source electrode connected to the first node Q.

In some embodiments, the odd stages of the gate driver 200 receive the first and second clock signals CLK1 and CLK2 and the modified first and second clock signals CLK1′ and CLK2″. The even stages can receive third and fourth clock signals CLK3 and CLK4 and modified third and fourth clock signals CLK3′ and CLK″. Low levels of the modified clock signals CLK1′, CLK2″, CLK3′, and CLK4″ can be higher than the low levels of the first to fourth clock signals CLK1 to CLK4. In some embodiments, the low levels of the modified second and fourth clock signals CLK2″ and CLK4″ are higher than the low levels of the modified first and third clock signals CLK1′ and CLK3′.

In some embodiments, the first DC voltage VGL1 is lower than the low level of the input signal S[N−1]. The second DC voltage VGL2 can be lower than the first DC voltage VGL1. The low level of the initialization signal SET can be substantially the same as the second DC voltage VGL2.

When the initialization signal SET becomes a high level H, the first and second nodes Q and QB can be initialized. For example, the first and second node signals QS and QBS correspond to the first DC voltage VGL1. The first and second capacitors C1 and C2 can store initial voltages (or boosted signals).

In the odd stage, when the first to fourth clock signals CLK1 to CLK4 have a high level H, the second node signal QBS can have a high level H by the second input circuit 120.

In the concurrent driving mode, when the first clock signal CLK1 and the input signal S[N−1] becomes a high level H, the first node signal QS can have a first high level H.

Then, when the first clock signal turns back to the low level, the second node signal QBS can have the low level L.

Then, when the second clock signal CLK2 has the high level H, the first node signal QS can have a second high level 2H and the gate output signal S[N] having the high level H is output to the output terminal.

Then, when the second clock signal CLK2 turns back the high level H, the first node signal QS can have the low level L, the second node signal QBS can have the high level, and the gate output signal S[N] can maintain the high level H.

As described above, the gate driver can decrease (or boost) the voltages applied to the gate electrodes of the switching elements that have the negative threshold voltages to have voltages lower than the threshold voltages (or source voltages of the switching elements) using the initializing circuit 250A and 205B and the capacitors. In addition, the gate driver can include the stabilizing circuit 240 that apply the first DC voltage VGL1 to the first node Q to stably maintain a turned-off state of the pull-up unit 260A. Thus, the NMOS switching elements can be normally turned on/off. As a result, abnormal output of the gate output signal S[N] from the gate driver according to the threshold voltage variations of the NMOS switching elements can be improved. Further, image quality and reliability of the display device 1000 having the NMOS switching elements can be improved.

The present embodiments can be applied to any display device having a gate driver driving a plurality of gate lines of the display device, and to a display system including the display device. For example, the described technology is applied to OLED displays, liquid crystal displays (LCDs), televisions, computer monitors, laptop computers, digital cameras, cellular phones, smartphones, personal digital assistants (PDAs), portable multimedia players (PMPs), MP3 players, navigation systems, video phones, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive technology is defined by the following claims, with equivalents of the claims to be included therein.

What is claimed is:

1. A gate driver for a display device, comprising:
a plurality of stages configured to respectively output a plurality of gate output signals, wherein an N-th stage of the stages is configured to receive first to fifth clock signals, where N is a positive integer, and comprises:
 a first input circuit configured to boost a first input signal to a first signal and transmit the first input signal to a first node based on the first signal;
 a second input circuit configured to boost the first input signal to a second signal and transmit the fifth clock signal and a first direct current (DC) voltage to a second node based on the first clock signal, the second clock signal, the fourth clock signal, and the second signal;
 a stabilizing circuit configured to boost a second input signal to a third signal, boost a second node signal to a fourth signal, and stabilize a first node signal based on the third signal, the fourth signal, and the third clock signal, wherein the first node signal corresponds to a signal at the first node, and wherein the second node signal corresponds to a signal at the second node;
 an initializing circuit configured to initialize voltages at the first and second nodes and the first to fourth signals based on a second DC voltage and an initialization signal; and
 a buffer circuit configured to output a gate output signal based on the first and second node signals.

2. The gate driver of claim 1, wherein the N-th stage further comprises first to third input terminals, wherein the first and third input terminals are configured to receive the first input signal, and wherein the first input circuit includes:
 a first input switching element having a gate electrode configured to receive the second clock signal, a drain electrode electrically connected to the third input terminal, and a source electrode;
 a second input switching element having a gate electrode configured to receive the first signal, a drain electrode electrically connected to the source electrode of the first input switching element, and a source electrode electrically connected to the first node, wherein the first input switching element is configured to block the first input signal from being applied to the first node; and
 a first capacitor electrically connected between the first input terminal and the gate electrode of the second input switching element and configured to boost the first input signal to the first signal.

3. The gate driver of claim 2, wherein the second input circuit includes:
 a third input switching element having a gate electrode configured to receive the first clock signal, a drain electrode configured to receive the fifth clock signal, and a source electrode;
 a fourth input switching element having a gate electrode configured to receive the fourth clock signal, a source electrode electrically connected to the second node, and a drain electrode electrically connected to the source electrode of the third input switching element, wherein the fourth input switching element is electrically connected to the third input switching element in series;
 a fifth input switching element having a gate electrode configured to receive the second signal, a drain electrode configured to receive the first DC voltage, and a source electrode; a sixth input switching element having a gate electrode configured to receive the second clock signal, a source electrode electrically connected to the second node, and a drain electrode electrically connected to the source electrode of the fifth input switching element, wherein the sixth input switching element is electrically connected to the fifth input switching element in series; and
 a second capacitor electrically connected between the third input terminal and the gate electrode of the fifth input switching element and configured to boost the first input signal to the second signal.

4. The gate driver of claim 3, wherein the second input terminal is configured to receive the second input signal, wherein the stabilizing circuit includes a first stabilizing circuit configured to stabilize the first node signal to the first DC voltage based on the third signal, and wherein the first stabilizing circuit includes:
 a first switching element having a gate electrode configured to receive the third signal, a drain electrode configured to receive the first DC voltage, and a source electrode electrically connected to the first node; and
 a third capacitor electrically connected between the second input terminal and the gate electrode of the first switching element and configured to boost the second input signal to the third signal.

5. The gate driver of claim 4, wherein the stabilizing circuit further includes a second stabilizing circuit configured to stabilize the first node signal to the first DC voltage based on the fourth signal and the third clock signal, and wherein the second stabilizing circuit includes:
 a second switching element having a gate electrode configured to receive the fourth signal, a drain electrode configured to receive the first DC voltage, and a source electrode;
 a third switching element having a gate electrode configured to receive the third clock signal, a source electrode electrically connected to the first node, and a drain electrode electrically connected to the source electrode of the second switching element; and
 a fourth capacitor electrically connected between the second node and the gate electrode of the second switching element and configured to boost the second node signal to the fourth signal.

6. The gate driver of claim 5, wherein the initializing circuit includes:
 a first initializing circuit configured to initialize the first, second, and fourth signals based on the second DC voltage; and
 a second initializing circuit configured to initialize the first and second node signals and the third signal based on the first and second DC voltages.

7. The gate driver of claim 6, wherein the first initializing circuit includes:
 a first initialization switching element configured to transmit the second DC voltage lower than the first DC voltage to the first capacitor based on the initialization signal so as to initialize a voltage in the first capacitor;

a second initialization switching element configured to transmit the second DC voltage to the fourth capacitor based on the initialization signal so as to initialize a voltage in the fourth capacitor; and a third initialization switching element configured to transmit the second DC voltage to the second capacitor based on the initialization signal so as to initialize a voltage in the second capacitor.

8. The gate driver of claim 6, wherein the second initializing circuit includes:

a fourth initialization switching element configured to transmit a first level of a first concurrent driving signal to the third input terminal based on the initialization signal, wherein the first concurrent driving signal has two levels: the first level and a second level greater than the first level;

a fifth initialization switching element configured to transmit the second DC voltage lower than the first DC voltage to the second capacitor based on the initialization signal so as to initialize a voltage in the second capacitor;

a sixth initialization switching element configured to transmit the first DC voltage to the first node based on the initialization signal; and a seventh initialization switching element configured to transmit the first DC voltage to the second node based on the initialization signal.

9. The gate driver of claim 1, wherein the buffer circuit includes:

a pull-up circuit configured to pull up the gate output signal based on the first node signal; and a pull-down circuit configured to pull down the gate output signal based on the second node signal.

10. The gate driver of claim 9, wherein the pull-up circuit includes a pull-up switching element having a gate electrode electrically connected to the first node, a drain electrode configured to receive a sixth clock signal, and a source electrode electrically connected to an output terminal configured to output the gate output signal, and wherein the pull-down circuit includes a pull-down switching element having a gate electrode electrically connected to the second node, a source electrode electrically connected to the output terminal, and a drain electrode configured to receive a first concurrent driving signal.

11. The gate driver of claim 10, wherein the sixth clock signal and the gate output signal each has two levels: a first level and a second level greater than the first level, wherein the sixth clock signal has a timing substantially the same as a timing of the third clock signal, and wherein the first level of the sixth clock signal is substantially the same as the first level of the gate output signal.

12. The gate driver of claim 9, wherein the N-th stage further includes a concurrent driving control circuit configured to deactivate the pull-up circuit based on a second concurrent driving signal, and wherein the concurrent driving control circuit includes a concurrent switching element having a gate electrode configured to receive the second concurrent driving signal, a drain electrode configured to receive the first DC voltage, and a source electrode electrically connected to the first node.

13. The gate driver of claim 1, wherein the first input signal has two levels: a first level and a second level greater than the first level, and wherein amplitudes of the first and second signals correspond to a voltage difference between the first level of the first input signal and the second DC voltage.

14. The gate driver of claim 1, wherein an amplitude of the fourth signal corresponds to a voltage difference between a voltage at the second node and the second DC voltage.

15. The gate driver of claim 1, wherein each of the gate output signal and the initialization signal has two levels: a first level and a second level greater than the first level, wherein the first DC voltage is lower than the first level of the gate output signal, wherein the second DC voltage is lower than the first DC voltage, and wherein the first level of the initialization signal is substantially the same as the second DC voltage.

16. The gate driver of claim 15, wherein each of the first to fourth clocks has two levels: a first level and a second level greater than the first level, wherein the first to fourth clock signals have different timings from each other, and wherein the first levels of the first to fourth clock signals are substantially the same as the second DC voltage.

17. The gate driver of claim 16, wherein the fifth clock has two levels: a first level and a second level greater than the first level, wherein the fifth clock signal has a timing substantially the same as a timing of the first clock signal, and wherein the first level of the fifth clock signal is substantially the same as the first level of the gate output signal.

18. A display device comprising:

a display panel including a plurality of pixels;

a data driver configured to output a plurality of data signals to the display panel via a plurality of data lines; and a gate driver including a plurality of stages configured to respectively output a plurality of gate output signals via a plurality of gate lines, wherein an N-th stage of the stages is configured to receive first to fifth cock signals, where N is a positive integer, and comprises:

a first input circuit configured to boost a first input signal to a first signal and transmit a first input signal to a first node based on the first signal;

a second input circuit configured to boost the first input signal to a second signal and transmit the fifth clock signal and a first direct current (DC) voltage to a second node based on the first clock signal, the second clock signal, the fourth clock signal, and the second signal;

a first stabilizing circuit configured to boost a second input signal to a third signal and stabilize a first node signal based on the third signal, wherein the first node signal corresponds to a signal at the first node;

a second stabilizing circuit configured to boost a second node signal to a fourth signal and stabilize the first node signal based on the fourth signal, wherein the second node signal corresponds to a signal at the second node;

an initializing circuit configured to initialize voltages at the first and second nodes and the first to fourth signals based on an initialization signal; and a buffer circuit configured to output a gate output signal based on the first and second node signals.

* * * * *